United States Patent [19]
Haraguchi

[11] Patent Number: 6,034,907
[45] Date of Patent: Mar. 7, 2000

[54] SEMICONDUCTOR INTEGRATED CIRCUIT DEVICE WITH BUILT-IN TEST CIRCUIT FOR APPLYING STRESS TO TIMING GENERATOR IN BURN-IN TEST

[75] Inventor: Yoshinori Haraguchi, Tokyo, Japan

[73] Assignee: NEC Corporation, Tokyo, Japan

[21] Appl. No.: 09/273,561

[22] Filed: Mar. 22, 1999

[30] Foreign Application Priority Data

Mar. 23, 1998 [JP] Japan .................................. 10-074746

[51] Int. Cl.[7] .................................................. G11C 7/00
[52] U.S. Cl. .................... 365/201; 365/193; 365/189.07; 365/191; 371/21.1
[58] Field of Search .................................. 365/191, 201, 365/189.01, 189.07, 193; 371/21.1, 10.1, 10.2, 191

[56] References Cited

U.S. PATENT DOCUMENTS

| | | | |
|---|---|---|---|
| 5,424,990 | 6/1995 | Ohsawa | 365/201 |
| 5,596,537 | 1/1997 | Sukegawa et al. | 365/201 |
| 5,638,331 | 6/1997 | Cha et al. | 365/201 |
| 5,710,737 | 1/1998 | Komiya et al. | 365/201 |
| 5,917,766 | 6/1999 | Tsuji et al. | 365/201 |
| 5,936,977 | 8/1999 | Churchill et al. | 371/22.31 |
| 5,970,004 | 10/1999 | Takami et al. | 365/200 |

*Primary Examiner*—Viet Q. Nguyen
*Attorney, Agent, or Firm*—Sughrue, Mion, Zinn, Macpeak & Seas, PLLC

[57] ABSTRACT

A semiconductor memory device has a device identification code to see whether or not a packet signal is addressed thereto, and a timing generator starts a control sequence for a data access in response to a hit signal representative of the consistency between the stored device identification code and an input device identification code incorporated in the packet signal, wherein a signal receiving circuit is shared between the packet signal and a test signal representative of instructions for burn-in test, and a logic gate is provided for directly generating the hit signal from an internal mode signal representative of the test mode so that the timing generator starts the control sequence in the burn-in test regardless of the consistency between the test signal and the stored device identification code.

11 Claims, 4 Drawing Sheets

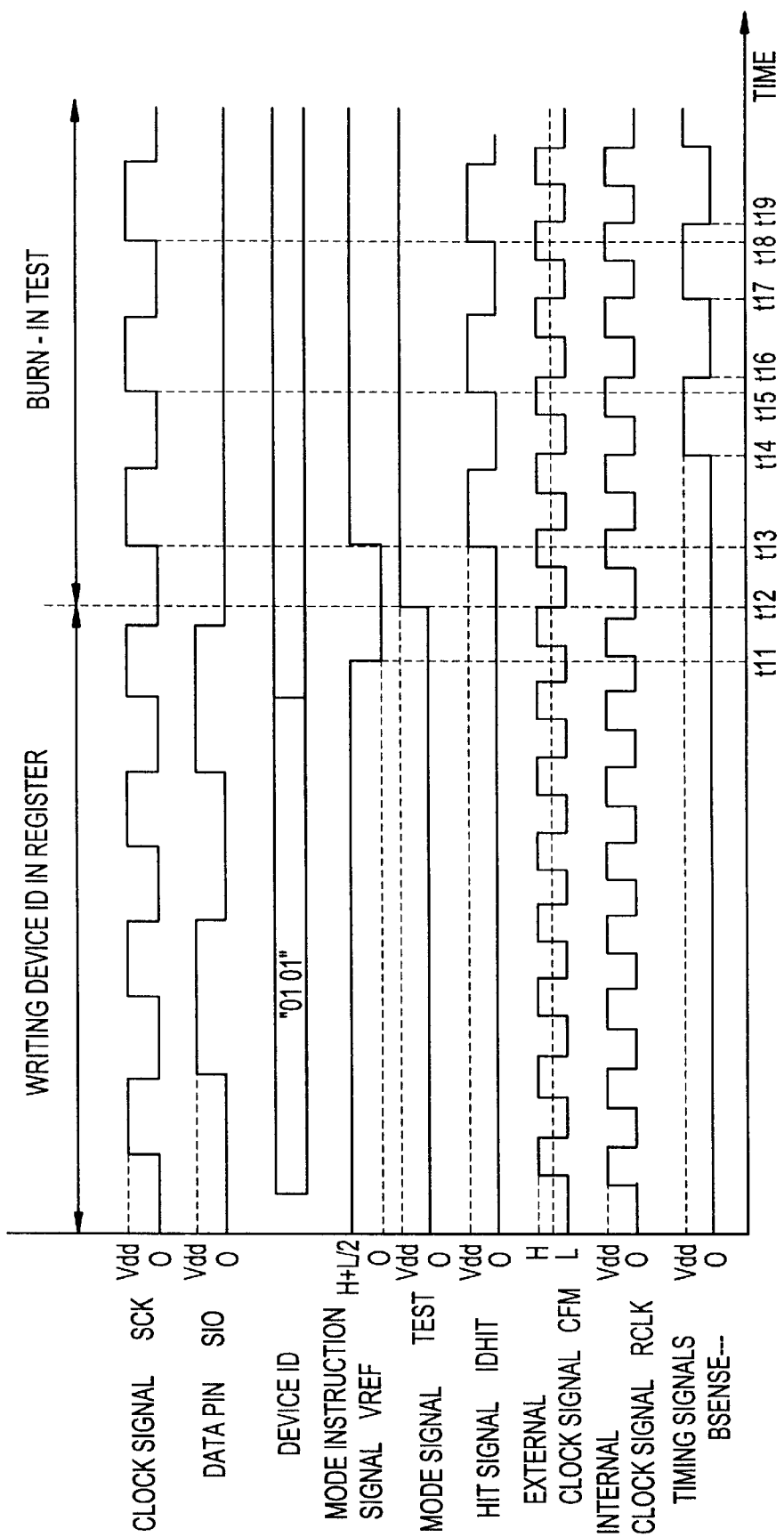

SEMICONDUCTOR INTEGRATED CIRCUIT DEVICE WITH BUILT-IN TEST CIRCUIT FOR APPLYING STRESS TO TIMING GENERATOR IN BURN-IN TEST

FIELD OF THE INVENTION

This invention relates to a semiconductor integrated circuit device and, more particularly, to a semiconductor integrated circuit device with a built-in test circuit for applying stress to a timing generator in burn-in test.

DESCRIPTION OF THE RELATED ART

The manufacturer usually guarantees a certain lifetime of products. A burn-in test is a kind of the life test process. The manufacturer applies stress to the product through the burn-in test so as to avoid an early failure in use. When the products are tested under the burn-in, potentially failure products are screened out, and only non-defective products are delivered to a customer.

A test circuit is built in a kind of the semiconductor integrated circuit device such as a semiconductor memory device, and assists a testing apparatus in the burn-in test. The built-in test circuit is responsive to test signals supplied from the testing apparatus in high-temperature atmosphere, and generates various internal control signals so as to selectively activate component circuits of the semiconductor memory device.

A kind of the semiconductor memory device stores a device identification code. A packet signal is supplied to the semiconductor memory device, and a device identification code and an instruction code are stored in the packet signal in accordance with a packet protocol. When the semiconductor memory device receives the packet signal, the semiconductor memory device checks the input device identification code of the packet signal to see whether or not the input instruction code is addressed to the semiconductor memory device. If the input device identification code is consistent with the stored device identification code, the timing generator is activated, and gives appropriate timings to a control signal generator. The control signal generator produces internal control signals at the given timings, and supplies the internal control signals to other component circuits. The other component circuits are sequentially activated with the internal control signals, and data bits are written into or read-out from memory cells.

The signal input port for the packet signal is shared with a test signal. While the semiconductor memory device is being subjected to the burn-in test, the test signal representative of an instruction is supplied from the testing apparatus through the signal input port to the control signal generator, and the control signal generator distributes the internal control signals to the other component circuits. Thus, the control signal generator produces the internal control signals from the test signal without assistance of the timing generator. This means that the timing generator is never examined in the burn-in test.

As described hereinbefore, the timing generator is activated only when the input device identification code is consistent with the stored device identification code, and the input signal port receives the test signal instead of the packet signal during the burn-in test. If a part of the bit string in the test signal is consistent with the stored device identification code, the timing generator is activated in the burn-in test. However, the possibility is negligible. As a result, the products are delivered without the burn-in test on the timing generator.

The timing generator takes the important part during the data access. If the timing generator is broken, the semiconductor device can not reach the end of the lifetime guaranteed by the manufacturer. Thus, the manufacturer requires a built-in test circuit, which allows the manufacturer to examine the timing generator in the burn-in test.

SUMMARY OF THE INVENTION

It is therefore an important object of the present invention to provide a semiconductor integrated circuit device, which has a test circuit so that the manufacturer can examine a timing generator through a burn-in test.

To accomplish the object, the present invention proposes to directly produce a hit signal from a mode signal representative of a test mode.

In accordance with one aspect of the present invention, there is provided a semiconductor integrated circuit device having a usual mode and a test mode, comprising a main circuit including a storage circuit for storing a first device identification code, a signal receiving circuit shared between a test signal supplied from the outside thereof in the test mode and an input signal supplied from the outside thereof in the usual mode and containing at least a data field assigned to a second device identification code, a comparing circuit connected to the storage circuit and the signal receiving circuit, comparing the second device identification code with the first device identification code to see whether or not the input signal is address to the semiconductor integrated circuit device and producing a preliminary hit signal when the second device identification code is consistent with the first device identification code and an initial stage circuit responsive to a hit signal for starting at least one predetermined control sequence for other circuits, and a test circuit including a detecting circuit responsive to an instruction signal representative of entry into the test mode for producing a test mode signal and a logic circuit connected to the comparing circuit and the detecting circuit and producing the hit signal from one of the preliminary hit signal and the test mode signal.

The test mode signal may represent a burn-in test.

BRIEF DESCRIPTION OF THE DRAWINGS

The features and advantages of the semiconductor integrated circuit device will be more clearly understood from the following description taken in conjunction with the accompanying drawings in which:

FIG. 4 is a timing chart showing a registration of a device identification code and a generation of a hit signal in a burn-in test;

DESCRIPTION OF THE PREFERRED EMBODIMENTS

First Embodiment

Figure 1:
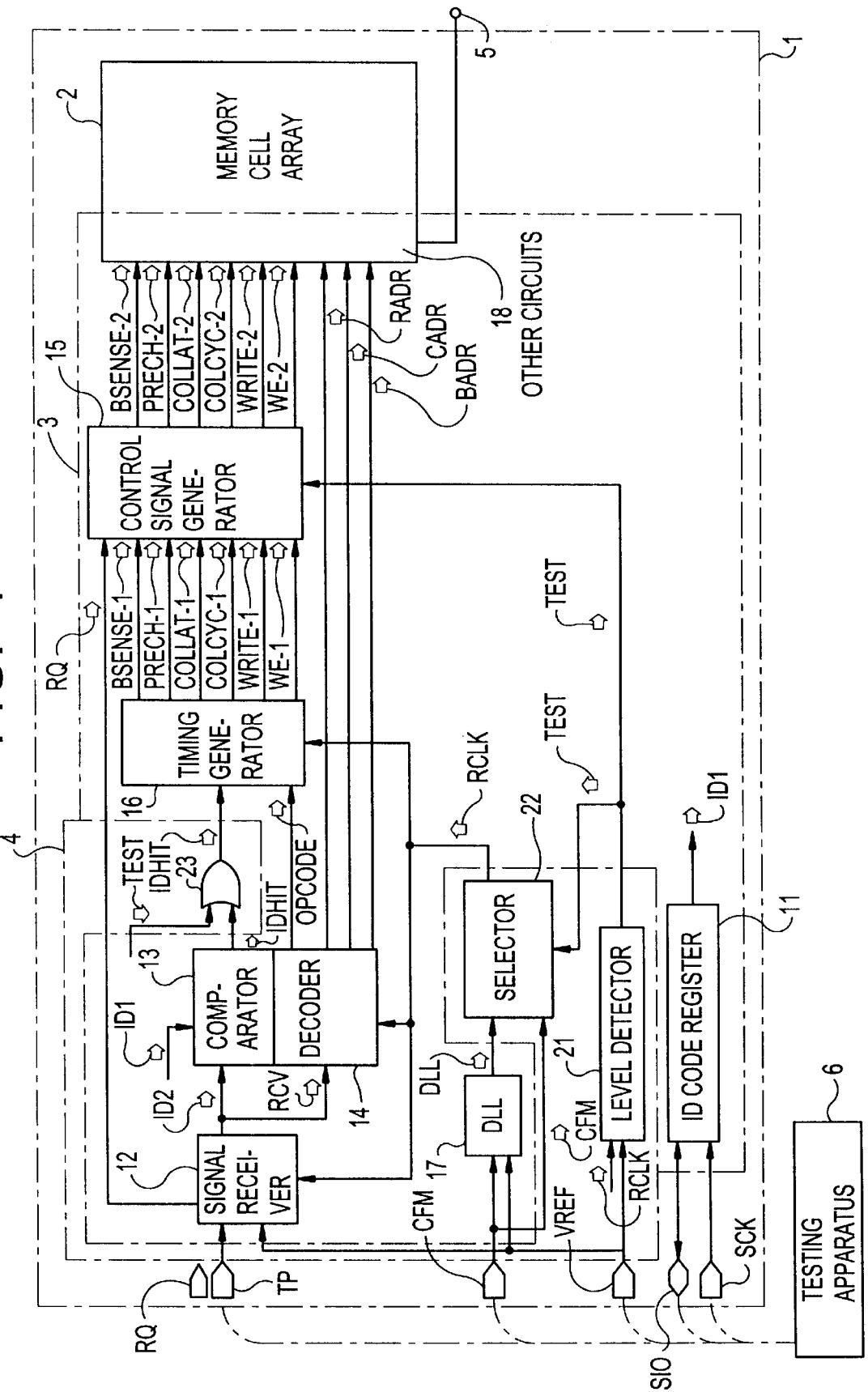
FIG. 1 is a block diagram showing the circuit configuration of a semiconductor memory device according to the present invention.

Referring to FIG. 1 of the drawings, a semiconductor memory device embodying the present invention is fabricated on a semiconductor chip 1. The semiconductor memory device is broken down into a memory cell array 2, a peripheral circuit 3 and a test circuit 4. The memory cell array 2 includes plural memory cells for storing data bits, and a bank address, a row address and a column address are assigned to each of the memory cells. For this reason, each memory cell is specified by using the bank address, the row address and the column address. The peripheral circuit 3 provides a data path between a data port 5 and the memory cell array 2 so as to write data bits into and read out the data bits from the memory cell array 2. The test circuit 4 assists a testing apparatus 6, and the memory cell array 2 and the peripheral circuit 3 are checked to see whether they have a defective circuit component through various test sequences. One kind of the test sequences is a burn-in test, and the memory cell array 2 and the peripheral circuit 3 operate under high-temperature atmosphere.

The peripheral circuit 3 includes a register 11, a signal receiver 12, a comparator 13, a decoder 14 and a control signal generator 15. A clock pin SCK and a data pin SIO are connected to the register 11, and a bit string representative of a device identification code is supplied to the data pin SIO. The resistor 11 latches the bits at the leading edges of the clock signal at the clock pin SCK. In this instance, the device identification code is represented by four bits, and four clock periods are required in storing the device identification code in the register 11. The register 11 supplies a code signal ID1 representative of the stored device identification code to the comparator 13.

The signal receiver 12 is shared between a packet signal RQ and a test signal TP. The packet signal RQ has at least three data fields. The first data field is assigned to a device identification code, the second data field is assigned to an instruction code, and the third data field is assigned to bank/row/column addresses.

While the semiconductor memory device is operating in a data access mode, the signal receiver 12 receives the packet signal RQ in synchronism both edges of an internal clock signal RCLK, and produces a code signal ID2 from the first data field and a data signal RCV from the second and third data fields. The code signal ID2 is representative of the input device identification code, and the data signal RCV is representative of the instruction and the bank/row/column addresses assigned to a memory cell to be accessed. The signal receiver 12 supplies the code signal ID2 and the data signal RCV to the comparator 13 and the decoder 14. The comparator 13 compares the input device identification code with the stored device identification code to see whether or not the instruction is addressed to the semiconductor memory device. If the answer is affirmative, the comparator 13 changes a hit signal IDHIT to an active high level. On the other hand, if the answer is negative, the comparator 13 keeps the hit signal IDHIT low. The decoder 14 decodes the data signal RCV to an instruction signal OPCODE, a bank address signal BADR, a row address signal RADR and a column address signal CADR.

On the other hand, when the semiconductor memory device enters a test mode, the signal receiver 12 receives the test signal TP in synchronism with both edges of the internal clock signal RCLK, and transfers the test signal TP to the control signal generator 15. The entry conditions will be hereinlater described in detail.

The peripheral circuit 3 further includes a timing generator 16, a delay locked loop 17 abbreviated as "DLL" and other circuits 18. A row address decoder, a column address decoder, a sense amplifier, a precharge circuit and an input/ output circuit are examples of the other circuits 18. These circuits are well known, and no further description is herein below incorporated. An external clock signal CFM is supplied to the delay locked circuit 17, and produces a phase-synchronous clock signal DLL in the data access mode.

The hit signal IDHIT activates the timing generator 16, and the timing generator 16 becomes responsive to the internal clock signal RCLK so as to sequentially generate timing signals BSENSE-1/PRECH-1/COLLAT-1/ COLCYC-1/WRITE-1/WE-1 after the activation. The timing signals BSENSE-1/PRECH-1/COLLAT-1/COLCYC-1/ WRITE-1/WE-1 are supplied to the control signal generator 15. Thus, the timing generator 16 is forcibly activated with the mode signal TEST at the high level indicative of the burn-in test, and the manufacturer can exert stress on the timing generator so as to screen out a defective product.

The control signal generator 15 is responsive to a mode signal TEST so as to produce timings signals BSENSE-2/ PRECH-2/COLLAT-2/COLCYC-2/WRITE-2/WE-2 from the timing signals BSENSE-1/PRECH-1/COLLAT-1/ COLCYC-1/WRITE-1/WE-1 in the data access mode and from the test signal RQ in the test mode. If the mode signal TEST is in the low level, the control signal generator 15 simply transfers the timing signals BSENSE-1/PRECH-1/ COLLAT-1/COLCYC-1/WRITE-1/WE-1 to the other circuits 18 as the timing signals BSENSE-2/PRECH-2/ COLLAT-2/COLCYC-2/WRITE-2/WE-2. On the other hand, if the mode signal TEST is at the high level, the control signal generator 15 produces the timing signals BSENSE-2/PRECH-2/COLLAT-2/COLCYC-2/WRITE-2/ WE-2 from the test signal RQ, and supplies the timing signals BSENSE-2/PRECH-2/COLLAT-2/COLCYC-2/ WRITE-2/WE-2 to the other circuits 18.

The test circuit 4 includes a level detector 21, a selector 22 and a logic gate 23. In this instance, the logic gate is implemented by an OR gate. A mode instruction signal VREF at a high level H is indicative of the data access mode, and is changed to a low level L in order to enter the test mode. The mode instruction signal VREF is maintained at an intermediate level during the registration of the device identification code and the burn-in test. In this instance, the external clock signal CFM is changed between the high level H and the low level L, and the intermediate level is given as (H+L)/2.

The level detector 21 detects the potential level of the mode instruction signal VREF, and determines the voltage level of the mode signal TEST. When the mode instruction signal is changed to the low level, the level detector 21 changes the mode signal TEST to the high level, and the mode signal TEST at the high level makes the memory cell array 2 and the peripheral circuit 3 ready for the burn-in test. While the mode instruction signal VREF is being maintained at the intermediate level, the level detector 21 fixes the mode signal TEST to the high level. On the other hand, when the level detector 21 acknowledges that the mode instruction signal VREF is recovered to the high level, the level detector 21 changes the mode signal TEST to the low level. The mode signal TEST is supplied to the selector 22, the control signal generator 15 and the logic gate 23.

The selector 22 is connected to the delay locked loop 17 and a clock pin assigned to the external clock signal CFM, and responsive to the mode signal TEST so as to selectively supply the phase synchronous clock signal DLL and the external clock signal CFM to the other circuits as the internal clock signal RCLK.

The OR gate 23 has two input nodes connected to the comparator 13 and the level detector 21, respectively. When the input device identification code is consistent with the input device identification code, the comparator 13 changes the hit signal IDHIT to the high level, and the high signal IDHIT at the high level triggers the timing generator so as to sequentially generate the timing signals BSENSE-1/PRECH-1/COLLAT-1/COLCYC-1/WRITE-1/WE-1 as described hereinbefore.

Figure 2:
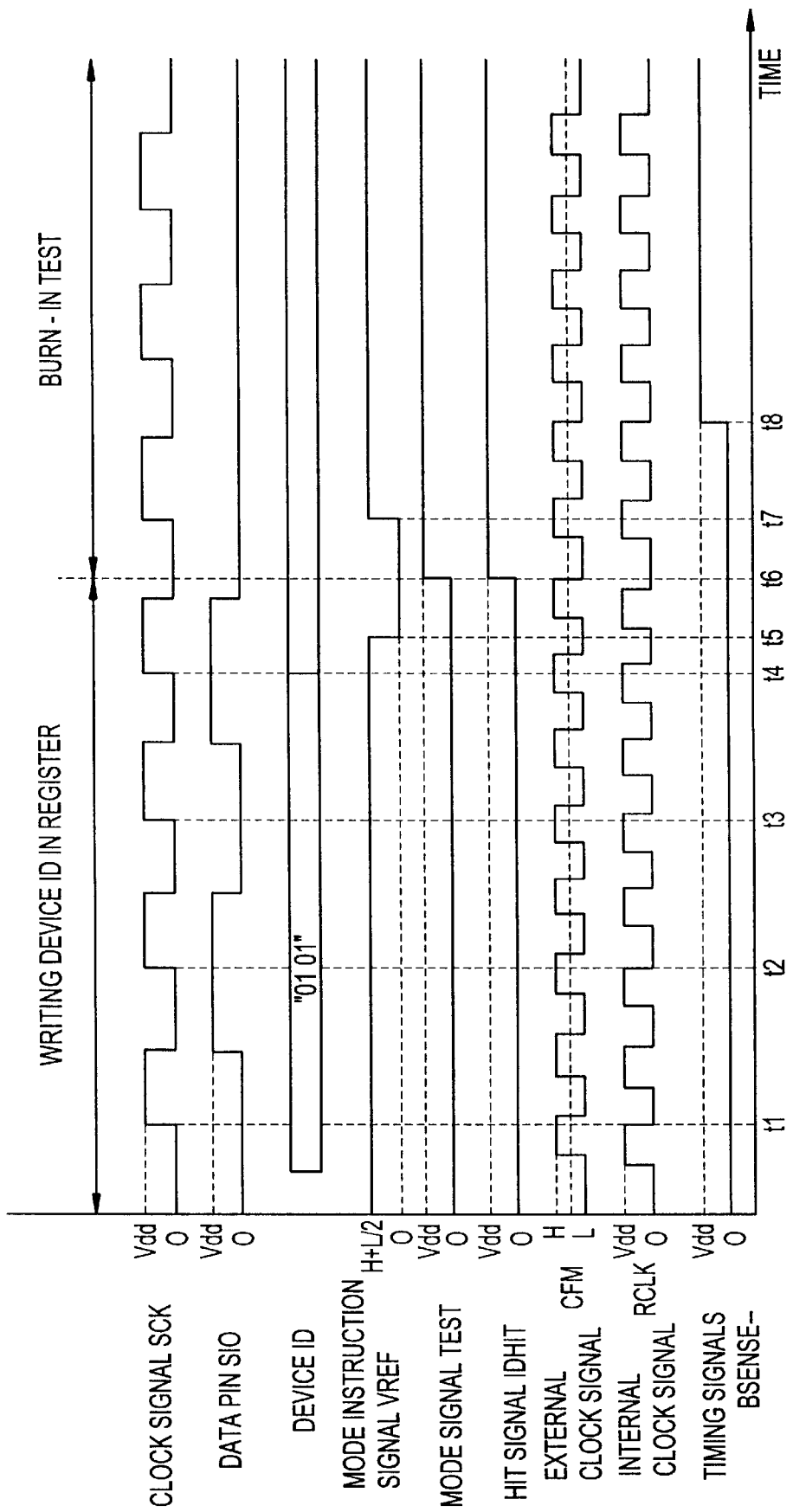
FIG. 2 is a timing chart showing a registration of a device identification code and a generation of a hit signal in a burn-in test.

Description is hereinbelow made on the circuit behavior in the burn-in test with reference to FIG. 2. The mode instruction signal VREF is maintained at the intermediate voltage level (H+L)/2, and makes the register 11 ready for storing the device identification code. The potential level at the data pin SIO is periodically changed, and the clock signal SCK rises at time t1, time t2, time t3 and time t4. The potential level at the data pin SIO is "0" at time t1, "Vdd" at time t2, "0" at time t3 and "Vdd" at time t4. The device identification code (0101) is stored in the register 11.

The mode instruction signal VREF is changed from the intermediate level to the low level at time t5, and is recovered to the intermediate level VREF at time t7. The level detector 21 acknowledges the request for the burn-in test, and changes the mode signal TEST to the high level at time t6.

The mode signal TEST at the high level causes the selector 22 to select the external clock signal CFM, and the external clock signal CFM is distributed to the other circuits as the internal clock signal RCLK.

The mode signal TEST at the high level is further supplied to the OR gate 23, and the OR gate 23 generates the hit signal IDHIT on the basis of the mode signal TEST at the high level regardless of the hit signal IDHIT at the output node of the comparator 13. As described hereinbefore, the test signal TP is supplied to the signal receiver 12 in the burn-in test. Even if the signal receiver 12 transfers certain data bits of the test signal TP corresponding to the first data field of the packet signal RQ to the comparator 13, there is a little possibility that the certain bits are consistent with the device identification code (0101). Nevertheless, the OR gate 23 generates the hit signal IDHIT from the mode signal TEST. As a result, the timing generator 16 is forced to generate the timing signals such as BSENSE-1 from time t8 under high-temperature atmosphere.

As will be understood from the foregoing description, even though the signal receiver 12 is shared between the packet signal RQ and the test signal TP, the logic gate 23 produces the high signal IDHIT from the mode signal TEST, and the timing generator 16 is examined in the burn-in test.

In this instance, the memory cell array 2 and the peripheral circuit 3 as a whole constitute a main circuit. The register 11, the signal receiver 12, the comparator 13 and the timing generator 16 are respectively corresponding to a storage circuit, a signal receiving circuit, a comparing circuit and an initial stage circuit. The level detector 21 and the OR gate 23 serve as a detecting circuit and a logic circuit, respectively. The burn-in test is carried out in the test mode, and a data access is performed in a usual mode.

Second Embodiment

Figure 3:
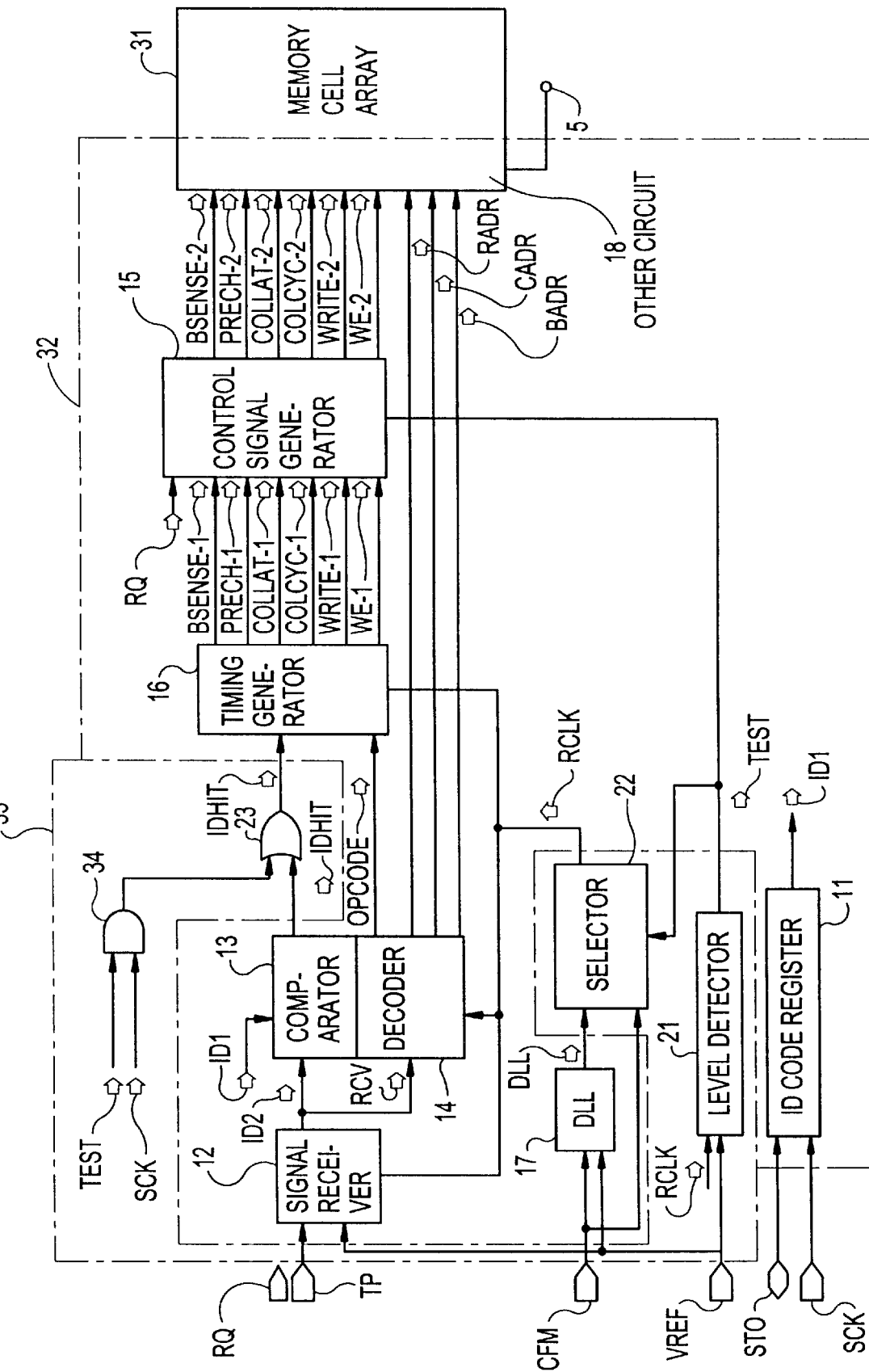
FIG. 3 is a block diagram showing the circuit configuration of another semiconductor memory device according to the present invention.

Turning to FIG. 3 of the drawings, another semiconductor memory device embodying the present invention largely comprises a memory cell array 31, a peripheral circuit 32 and a test circuit 33. The memory cell array 31 and the peripheral circuit 32 are similar to those of the first embodiment, and the components of the peripheral circuits 32 are labeled with the same references designating corresponding components of the peripheral circuit 3 without detailed description.

An AND gate 34 is added to the test circuit 33. The mode signal TEST and the clock signal SCK are supplied to the input nodes of the AND gate 34, and the output node of the AND gate 34 is connected to the input node of the OR gate 23.

FIG. 4 illustrates the registration of a device identification code "0101" and a burn-in test. The device identification code is stored in the register 11 as similar to the first embodiment, and the registration is not described for avoiding repetition.

The mode instruction signal VREF is changed to the low level at time t11, and is recovered to the high level at time t13. The level detector 21 acknowledges the request for a burn-in test, and changes the mode signal TEST to the high level at time t12. The level detector 21 keeps the mode signal TEST at the high level after time t12.

The mode signal TEST is supplied to the input node of the AND gate 34, and is ANDed with the clock signal SCK. The clock signal SCK is periodically changed to the high level at time t13, time t15 and time t18, accordingly, the AND gate supplies the high level to the OR gate 23. As a result, the OR gate 23 periodically changes the hit signal IDHIT to the active high level at time t13, time t15 and time t18. The hit signal IDHIT is supplied to the timing generator 16, and the timing generator 16 is activated at time t14 and time t17 and deactivated at time t16 and time t19. Thus, the test circuit 33 causes the timing generator 16 to repeat the activation and the deactivation, and the manufacturer checks the entire function of the timing generator 16 in the burn-in test.

In this instance, the AND gate 34 and the OR gate 23 as a whole constitute the logic gate.

Although particular embodiments of the present invention have been shown and described, it will be apparent to those skilled in the art that various changes and modifications may be made without departing from the spirit and scope of the present invention.

For example, the present invention is applicable to any kind of semiconductor integrated circuit device in so far as the semiconductor integrated circuit device has a signal receiver shared between a test signal and an input signal containing a device identification code for activating it.

In the above-described embodiments, the OR gate is connected between the comparator/level detector and the timing generator 16. However, the logic function to be required is dependent on the combination of the active levels of the mode/hit signals. The logic gate 23 may be implemented by an AND gate, a NOR gate, a NAND gate or a combination of different logic gates.

What is claimed is:

1. A semiconductor integrated circuit device having a usual mode and a test mode, comprising:

a main circuit including a storage circuit for storing a first device identification code, a signal receiving circuit shared between a test signal supplied from the outside thereof in said test mode and an input signal supplied from the outside thereof in said usual mode and containing at least a data field assigned to a second device identification code, a comparing circuit connected to said storage circuit and said signal receiving circuit, comparing said second device identification code with said first device identification code to see whether or not said input signal is address to said semiconductor integrated circuit device and producing a preliminary hit signal when said second device identification code is consistent with said first device identification code, and an initial stage circuit responsive to a hit signal for starting at least one predetermined control sequence for other circuits; and a test circuit including
- a detecting circuit responsive to an instruction signal representative of entry into said test mode for producing a test mode signal, and
- a logic circuit connected to said comparing circuit and said detecting circuit and producing said hit signal from one of said preliminary hit signal and said test mode signal.

2. The semiconductor integrated circuit device as set forth in claim 1, in which said test mode signal is representative of a burn-in test, and said main circuit operates under a stress in said burn-in test.

3. The semiconductor integrated circuit device as set forth in claim 1, in which said main circuit includes a memory cell array for storing data bits and a peripheral circuit for propagating said data bits to and from a data port, and said storage circuit, said signal receiving circuit, said comparing circuit and said initial stage circuit are incorporated in said peripheral circuit.

4. The semiconductor integrated circuit device as set forth in claim 3, in which said test mode signal is representative of a burn-in test, and said memory cell array and said peripheral circuit operate under a stress in said burn-in test.

5. The semiconductor integrated circuit device as set forth in claim 3, in which said initial stage circuit is a timing generator for sequentially generating preliminary timing signals for controlling a data propagation between said memory cell array and said data port.

6. The semiconductor integrated circuit device as set forth in claim 5, in which said peripheral circuit further includes a control signal generator having a first input port connected to said timing generator and a second input port supplied with said test signal and responsive to a potential level of said test mode signal for producing timing signals from one of said preliminary timing signals and said test signal.

7. The semiconductor integrated circuit device as set forth in claim 6, in which said test mode signal is representative of a burn-in test, and said timing generator and said control signal generator operate under a stress in said burn-in test.

8. The semiconductor integrated circuit device as set forth in claim 1, in which said logic circuit includes a first logic gate supplied with said preliminary hit signal and said test mode signal for producing said hit signal.

9. The semiconductor integrated circuit device as set forth in claim 8, in which said first logic gate is an OR gate.

10. The semiconductor integrated circuit device as set forth in claim 8, in which said logic circuit further includes a second logic gate supplied with said test mode signal and a clock signal for periodically passing said test mode signal to said first logic gate.

11. The semiconductor integrated circuit device as set forth in claim 10, in which said first logic gate and said second logic gate are an OR gate and an AND gate.

* * * * *